(12) United States Patent
Shimizu (10) Patent No.: US 8,489,347 B2
(45) Date of Patent: Jul. 16, 2013

(54) BATTERY PACK MONITORING APPARATUS (75) Inventor: Takumi Shimizu, Yokkaichi (JP)

(73) Assignee: Denso Corporation, Kariya (JP)

( * ) Notice: Subject to any disclaimer, the term of this patent is extended or adjusted under 35 U.S.C. 154(b) by 296 days.

(21) Appl. No.: 13/025,488

(22) Filed: Feb. 11, 2011

(65) Prior Publication Data

US 2011/0196632 A1 Aug. 11, 2011

(30) Foreign Application Priority Data

Feb. 11, 2010 (JP) .................................. 2010-028316
Jul. 29, 2010 (JP) .................................. 2010-170164

(51) Int. Cl.
*G01R 21/06* (2006.01)
*G01R 19/00* (2006.01)

(52) U.S. Cl.
USPC ..................... 702/62; 702/63; 702/64; 702/65

(58) Field of Classification Search
USPC ............... 702/63–65, 85, 116–118, 182, 188, 702/189

See application file for complete search history.

(56) References Cited

U.S. PATENT DOCUMENTS

2004/0051534 A1* 3/2004 Kobayashi et al. ........... 324/429
2007/0202371 A1* 8/2007 Takeda et al. .................... 429/23

FOREIGN PATENT DOCUMENTS

JP 2007-232417 9/2007

* cited by examiner

*Primary Examiner* — Phuong Huynh
(74) *Attorney, Agent, or Firm* — Nixon & Vanderhye PC (57) ABSTRACT

The battery pack monitoring apparatus is for monitoring a battery pack constituted of battery blocks connected in series and each including battery cells connected in series. The battery pack monitoring apparatus includes a cell monitoring circuits provided respectively for the battery blocks, and a control circuit. Each of the cell monitoring circuits includes a cell voltage detection circuit to detect cell voltages of the battery cells included in a corresponding one of the battery blocks, and a block voltage detection circuit to detect a block voltage of the corresponding one of the battery blocks. The control circuit is configured to detect states of the battery cells based on the cell voltages and the block voltages transmitted from the respective cell monitoring circuits.

9 Claims, 5 Drawing Sheets

BATTERY PACK MONITORING APPARATUS

This application claims priority to Japanese Patent Applications No. 2010-28316 filed on Feb. 11, 2010 and No. 2010-170164 filed on Jul. 29, 2010, the entire contents of which are hereby incorporated by reference.

BACKGROUND OF THE INVENTION

1. Field of the Invention

The present invention relates to a battery pack monitoring apparatus for monitoring a battery pack constituted of battery blocks connected in series and each including battery cells connected in series.

2. Description of Related Art

As such a battery pack monitoring apparatus, there is known the one which includes a voltage detection component provided for each of the battery blocks. For example, refer Japanese Patent Application Laid-open No. 2007-232417. Such voltage detection components can be implemented as an IC, for example.

However, the conventional battery pack monitoring apparatus as described in the above patent document has a problem in that the amount of data to be handled becomes enormous when it is used for a system which uses a number of battery cells such as the one for use in an electric vehicle, because the battery voltage has to be detected for each of the battery cells.

Take an electric vehicle on which 240 battery cells are mounted as an example, since each of the battery cells is charged and discharged with a large current at a high frequency, an expensive computation circuit is needed to perform high-rate data sampling and processing in order to monitor the states of each of the battery cells.

SUMMARY OF THE INVENTION

The present invention provides a battery pack monitoring apparatus for monitoring a battery pack constituted of battery blocks connected in series and each including battery cells connected in series, comprising:

cell monitoring circuits provided respectively for the battery blocks, each of the cell monitoring circuits including a cell voltage detection circuit to detect cell voltages of the battery cells included in a corresponding one of the battery blocks, and a block voltage detection circuit to detect a block voltage of the corresponding one of the battery blocks; and a control circuit configured to detect states of the battery cells based on the cell voltages and the block voltages transmitted from the respective cell monitoring circuits.

According to the present invention, it is possible to reduce an amount of data handled by a battery pack monitoring apparatus.

Other advantages and features of the invention will become apparent from the following description including the drawings and claims.

PREFERRED EMBODIMENTS OF THE INVENTION

First Embodiment

Figure 1:
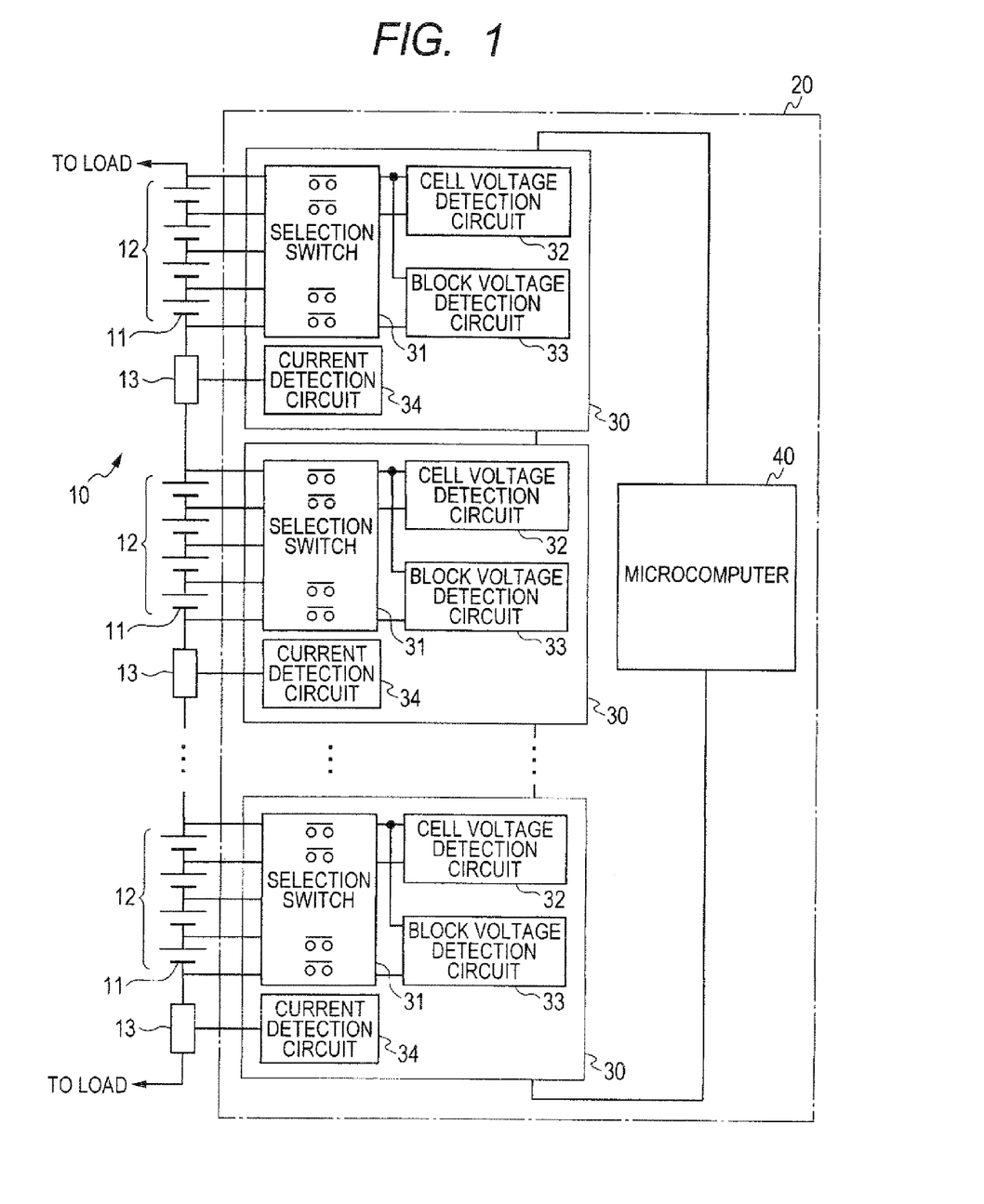
FIG. 1 is a diagram showing the structure of a battery pack monitoring system including a battery pack monitoring apparatus according to a first embodiment of the invention.

FIG. 1 is a diagram showing the overall structure of a battery pack monitoring system including a battery pack monitoring apparatus 20 according to a first embodiment of the invention. As shown in FIG. 1, the battery pack monitoring system includes the battery voltage monitoring apparatus 20 and a battery pack 10.

The battery pack 10 is constituted of a plurality of (120 or 240, for example) battery cells 11 connected in series. The battery cells 11 are grouped into blocks 12 connected in series each including a predetermined number of (4, for example) the battery cells 11. The battery cell 11 may be a rechargeable lithium-ion battery. The battery pack 10 is mounted on an electric vehicle or a hybrid vehicle to be used as a power supply for supplying power to electrical loads including an inverter, a motor and electronic devices.

The battery pack monitoring apparatus 20 has a function of detecting the remaining capacity of the battery pack 10, a function of detecting overcharge or overdischarge of the battery cells 11, and a function of performing a fault diagnosis to detect a fault in the circuit of the battery pack monitoring apparatus 20.

The remaining capacity detecting function operates to detect the remaining capacity (SOC: state of charge) of the whole battery pack 10 constituted of the battery cells 11 based on the voltage or current of the battery pack 10.

The overcharge/overdischarge detecting function operates to monitor the voltage of each of the battery cells 11 by performing a comparison between the cell voltage (the voltage of the battery cell 11) and a threshold value. More precisely, since the battery cell 11 is a secondary battery, the battery pack monitoring apparatus 20 monitors whether the voltage of each battery cell 11 is between a threshold value to detect overcharge and a threshold to detect overdischarge. The fault diagnosing function operates to detect a fault in the circuit of the battery pack monitoring apparatus 20.

To implement the above functions, the battery pack monitoring apparatus 20 includes a plurality of cell monitoring circuits 30 and a microcomputer 40.

The cell monitoring circuits 30, which are provided for the respective blocks 12, performs detection of the cell voltages (the voltages of the battery cells 11), detection of the block voltage (the voltage of the block 12), detection of overcharge/overdischarge of the battery cells 11, and equalization of the cell voltages of the battery cells 11. The cell monitoring circuits 30 may be implemented as an IC.

The cell monitoring circuits 30 are connected in a daisy chain manner to enable serial communication between the cell monitoring circuits 30 and the microcomputer 40, and to enable a command from the microcomputer 40 to be sent from the cell monitoring circuit 30 on the highest voltage side toward the cell monitoring circuit 30 on the lowest voltage side. The microcomputer 40 is inputted with data of the respective cell monitoring circuits 30 from the cell monitoring circuit 30 on the lowest voltage side.

Each of the cell monitoring circuits 30 is constituted of a selection switch 31, a cell voltage detection circuit 32, a block voltage detection circuit 33 and a current detection circuit 34.

The selection switch 31 is a switch circuit to make electrical connection between the respective battery cells 11 constituting the block 12 and the cell voltage detection circuit 32, and electrical connection between the block 12 and the block voltage detection section 33. The selection switch 31 may be implemented as a multiplexer.

To detect the cell voltage, the internal signal paths of selection switch 31 are set such that the positive and negative electrodes of one of the battery cells 11 constituting the block 12 are connected to input terminals of the cell voltage detection circuit 32. On the other hand, to detect the block voltage, the internal signal paths of selection switch 31 are set such that the positive and negative electrodes of the battery cell 11 on the highest voltage side of all the battery cells 11 constituting the block 12 are connected to input terminals of the block voltage detection section 33.

By using the selection switch 31 for input selection for both the cell voltage detection circuit 32 and the block voltage detection circuit 33, the cell monitoring circuit can be simplified in structure. Setting the internal signal paths of the selection switch 31 can be carried out by a command from the microcomputer 40, for example.

The cell voltage detection circuit 32 is a circuit to detect the cell voltage of each of the battery cells 11 constituting the block 12. The block voltage detection circuit 33 is a circuit to detect the block voltage of the block 12. Data indicative of the cell voltages detected by the cell voltage detection circuit 32 and data indicative of the block voltage detected by the block voltage detection circuit 33 are successively outputted to the microcomputer 40 in a daisy chain manner.

Each of the cell voltage detection circuit 32 and the block voltage detection circuit 33 may be implemented using a comparator. A predetermined gain to amplify the cell voltage is set in the cell voltage detection circuit 32. A predetermined gain to amplify the block voltage is set in the block voltage detection circuit 33. Alternatively, these voltage detection circuits may be a flying capacitor type voltage detection circuit.

The frequency at which the cell voltage is detected can be set to an arbitrary value in the cell voltage detection circuit 32. Likewise, the frequency at which the block voltage is detected can be set to an arbitrary value in the block voltage detection circuit 33.

If the block voltage detection is performed once while the cell voltage detection is performed four times, the frequency of the cell voltage detection is equal to the frequency of the block voltage detection, because the block 12 is constituted of four battery cells 11. If the block voltage detection is performed once while the cell voltage detection is performed one to three times, the frequency of the block voltage detection is higher than the frequency of the cell voltage detection.

In this embodiment, the frequency of the block voltage detection is set higher than the frequency of the cell voltage detection in order to reduce the amount of data to be handled in the cell monitoring circuits 30 and the microcomputer 40.

The voltage detection frequencies are set respectively in the cell voltage detection circuit 32 and the block voltage detection section 33 in accordance with commands from the microcomputer 40. When the cell voltage detection circuit 32 and the block voltage detection section 33 are implemented as an IC, the voltage detection frequencies may be set by setting specific pins of the IC to predetermined levels.

In this embodiment, since the cell voltage detection frequency and the block voltage detection frequency can be set independently, it is possible to set each of the frequency at which data of the cell voltages is obtained and the frequency at which data of the block voltages is obtained to an arbitrary value.

The current detection circuit 34 is a circuit for detecting the current flowing through the battery cells 11 constituting the block 12 at the time of detecting the remaining capacity of the battery pack 10. The current detection circuit 34 receives apart of the current flowing through the block 12 from a branch section 13, and determines the value of the current based on the voltage across a resistor (not shown) through which the part of the current is passed.

The microcomputer 40 includes a CPU, a ROM, an EEPROM and a RAM, and operates as a control circuit by executing programs stored in the ROM to implement the above described functions. The microcomputer 40 outputs control signals or commands to the daisy chained cell monitoring circuits 30 to cause them to perform necessary processes. The microcomputer 40 also receives data from the cell monitoring circuits 30 to calculate the remaining capacity of the battery pack 10, detect overcharge/overdischarge and perform fault diagnosis.

More specifically, the microcomputer 40 performs the below described operations. The microcomputer 40 outputs a command to set the block voltage detection frequency higher than the cell voltage detection frequency for each one of the battery cells 11 constituting the block 12 to the respective cell monitoring circuits 30. For example, the command is such that the cell voltage detection is performed once each time the block voltage detection is performed once.

Thereafter, the microcomputer 40 performs comparison between the cell voltages included in the data received from the cell monitoring circuits 30 and the overcharge threshold or overdischarge threshold to detect presence or absence of overcharge or overdischarge for each of the battery cells 11. For example, if the microcomputer 40 detects an overcharge, the microcomputer 40 outputs a command to charge the overcharged battery cell 11 to equalize the voltage of this battery cell 11 with the other battery cells 11 to the cell monitoring circuit 30 including this overcharged battery cell 11.

Also, to detect the remaining capacity of the battery pack 10, the microcomputer 40 outputs a command to perform both the block voltage detection and the block current (the current flowing through the block 12) detection at the same time to the respective cell monitoring circuits 30. The microcomputer 40 calculates the remaining capacities of the respective blocks 12 to detect the remaining capacity of the battery pack 10, based on data of the block voltages of the blocks 12 and data of the block currents of the blocks 12 outputted from the respective cell monitoring circuits 30. In this embodiment, since the remaining capacities are calculated using not the data of the cell voltages and the data of the cell currents of all the battery cells 11 constituting the battery pack 10, but the data of the block voltages and the data of the block currents of each of the blocks 12, the amount of data to be handled by the cell monitoring circuits 30 and the microcomputer 40 is significantly reduced.

The microcomputer 40 also performs comparison between the sum of the cell voltages of the four battery cells 11 constituting the block 12 and the block voltage of this block 12 to detect fault in the cell voltage detection circuit 32 and the block voltage detection circuit 33.

When the cell voltage detection circuit 32 and the block voltage detection circuit 33 operate normally, the sum of the cell voltages of the four battery cells 11 is equal to the block voltage. If at least one of the cell voltage detection circuit 32 and the block voltage detection circuit 33 malfunctions, the sum of the cell voltages of the four battery cells 11 is not equal to the block voltage. Accordingly, the microcomputer 40 determines that the cell voltage detection circuit 32 and the block voltage detection circuit 33 are operating normally if the difference between the sum of the cell voltages of the four battery cells 11 and the block voltage is within a predetermined tolerable range, and determines that at least one of them is faulty if the difference is outside the tolerable range.

If the block voltage received from any of the cell monitoring circuits 30 exceeds a predetermined range, the microcomputer 40 outputs a command to set the cell voltage detection frequency higher than the block voltage detection frequency to this cell monitoring circuit 30. Upon receiving this command, this cell monitoring circuit 30 makes a change so that the cell voltage detection frequency set in the cell voltage detection circuit 32 becomes higher than the block voltage detection frequency set in the block voltage detection circuit 33.

Here, the "predetermined range" is a range within which the sum of the cell voltages of the four battery cells 11 is regarded to be normal. The above is based on the assumption that when the block voltage is as high as exceeding the upper limit of the predetermined range, there is a high possibility that the battery cells 11 are overcharged, and accordingly it is necessary to perform the cell voltage detection at a higher frequency to quickly determine presence or absence of an overcharge. Likewise, if the block voltage is as low as falling below the lower limit of the predetermined range, since it means that there is a high possibility that the battery cells 11 are over-discharged, the cell voltage detection frequency is increased to quickly determine presence or absence of an overdischarge.

Incidentally, instead of the configuration in which the command to set the cell voltage detection frequency higher than the block voltage detection frequency is outputted to the cell monitoring circuit 30 in question, there may be adopted a configuration in which each of the cell monitoring circuits 30 performs a comparison between the block voltage and the predetermined range for itself and sets the cell voltage detection frequency higher than the block voltage detection frequency, if the block voltage is outside the predetermined range.

As explained above, this embodiment includes the block voltage detection circuit 33 to detect the block voltage of the block 12 for each of the cell monitoring circuits 30.

This configuration is possible because the remaining capacity of the battery pack 10 can be detected by calculating the remaining capacities of the respective blocks 12. Accordingly, according to this embodiment, it is possible to significantly reduce the amount of data to be handled by the cell monitoring circuits 30 and the microcomputer 40 compared to the case where the remaining capacity of the battery pack 10 is detected by detecting the cell voltages of all the battery cells 11.

Further, since this embodiment detects whether or not the block voltage is within the predetermined range for each of the blocks 12, it is not necessary to detect overcharge or overdischarge for each of the battery cells 11. Further, since the charged state is monitored for each of the battery cells 11, it is possible to identify the overcharged or over-discharged battery cell 11 when the block voltage deviates from the predetermined range. Accordingly, according to this embodiment, even when the amount of data handled by the cell monitoring circuits 30 and the microcomputer 40 is limited, it is possible to reliably monitor the remaining capacity of the battery pack 10 and quickly eliminate overcharge and over-discharge of the battery cells 11.

Second Embodiment

Next, a second embodiment of the invention is described focusing on the difference with the first embodiment. In the first embodiment described above, the cell voltage detection circuit 32 and the block voltage detection circuit 33 are provided as separate circuits. In the second embodiment, the cell voltage detection circuit 32 and the block voltage detection circuit 33 are provided as the same one circuit.

Figure 2:
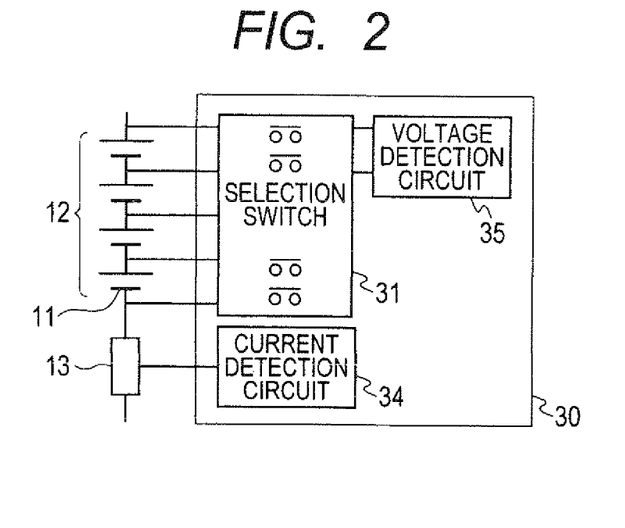
FIG. 2 is a diagram showing the partial structure of a battery pack monitoring system including a battery pack monitoring apparatus according to a second embodiment of the invention.

FIG. 2 is a diagram showing the structure of the cell monitoring circuit 30 of the battery pack monitoring apparatus 20 of this embodiment. In FIG. 2, only one of the cell monitoring circuits 30 is shown, and the other cell monitoring circuits 30 and the microcomputer 40 are omitted from illustration.

As shown in FIG. 2, the cell monitoring circuit 30 includes, other than the selection switch 31 and the current detection circuit 34, a voltage detection circuit 35 as a replacement of the cell voltage detection circuit 32 and the block voltage detection circuit 33 used in the first embodiment.

Figure 3A:
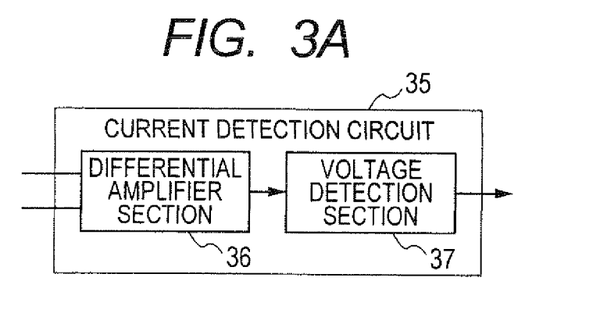
FIG. 3A is a diagram showing the structure of a voltage detection circuit included in the battery pack monitoring apparatus of the second embodiment.

The voltage detection circuit 35 is a circuit for detecting both the cell voltage of the battery cells 11 and the block voltage of the block 12. As shown in FIG. 3A, the voltage detection circuit 35 is constituted of a differential amplifier section 36 and a voltage detection section 37. The voltage detection section 37 may be implemented using a comparator.

The differential amplifier section 36 is a circuit for amplifying the cell voltage and the block voltage. In the differential amplifier section 36, the gain to amplify the cell voltage and the gain to amplify the block voltage are set independently.

Figure 3B:
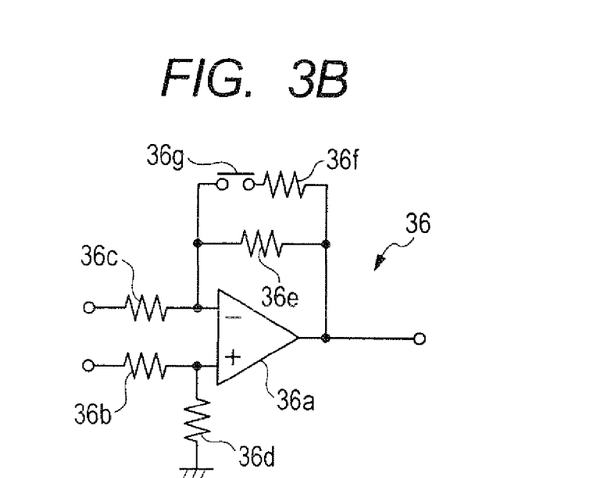
FIG. 3B is a circuit diagram of a differential amplifier section of the voltage detection circuit included in the battery pack monitoring apparatus of the second embodiment.

FIG. 3B is a diagram showing an example of the structure of the differential amplifier section 36. As shown in FIG. 3B, in this embodiment, the differential amplifier section 36 is implemented as an inverting amplifier circuit including an operational amplifier 36a. The operational amplifier 36a is connected with a resistor 36b at the non-inverting input terminal thereof, and connected with a resistor 36c at the inverting input terminal thereof. The resistors 36b and 36c are connected with a selected one of the battery cells 11 through the selection switch 31. A resistor 36d is connected between the non-inverting input terminal of the operational amplifier 36a and the ground to set an offset voltage.

A resistor 36e and a series connection of a resistor 36f and a switch 36g are connected in parallel between the output terminal and the inverting input terminal of the operational amplifier 36a to set the gain of the differential amplifier section 36. Accordingly, the negative feedback resistance determining the gain of the differential amplifier section 36 depends on the resistance of the parallel connection of the resistors 36e and 36f when the switch 36g is on, while it depends on the resistance of the resistor 36e when the switch 36g is off.

It is possible that the voltage detection circuit 35 constituted of the differential amplifier section 36 and the voltage detection section 37 serves as the cell voltage detection circuit 32 by turning off the switch 36g to increase the gain of the differential amplifier section 36 in order to detect the cell voltage. That is, the voltage detection circuit 35 constituted of the differential amplifier section 36 with the switch 36g being turned off and the voltage detection section 37 is functionally the same as the cell voltage detection circuit 32 used in the first embodiment.

Likewise, it is possible that the voltage detection circuit 35 constituted of the differential amplifier section 36 and the voltage detection section 37 serves as the block voltage detection circuit 33 by turning on the switch 36g to reduce the gain of the differential amplifier section 36 in order to detect the block voltage. That is, the voltage detection circuit 35 constituted of the differential amplifier section 36 with the switch 36g being turned on and the voltage detection section 37 is functionally the same as the block voltage detection circuit 33 used in the first embodiment.

In other words, the block voltage detection circuit 33 can be formed by adding the switch 36 and the resistor 36f to the cell voltage detection circuit 32 used in the first embodiment.

As explained above, by making the gain of the differential amplifier section 36 adjustable, the voltage detection circuit 35 can detect both the cell voltage and the block voltage. According to the second embodiment, the cell monitoring circuit 30 can be simplified in structure.

Third Embodiment

Next, a third embodiment of the invention is described focusing on the difference with the first and second embodiments. In the first and second embodiments, the Selection switch 31 of the cell monitoring circuit 30 is used both for making a connection between one of the battery cells 11 and the cell voltage detection circuit 32 and for making a connection between the block 12 and the block voltage detection circuit 33. In the third embodiment, however, instead of using the single selection switch 31, two selection switches are used respectively for detecting the cell voltage and for detecting the block voltage.

In more detail, the selection switch 31 of the cell monitoring circuit 30 is replaced by a cell voltage detection selection switch and a block voltage detection selection switch.

The cell voltage detection selection switch is a switch for connecting the input terminals of the cell voltage detection circuit 32 to the positive and negative electrodes of one of the battery cells 11. The block voltage detection selection switch is a switch for connecting the input terminals of the block voltage detection circuit 33 to the positive electrode of the battery cell 11 on the highest voltage side of the block 12 and the negative electrode of the battery cell 11 on the lowest voltage side of the block 12.

By replacing the selection switch 31 with these two separate switches, the accuracy of voltage detection can be improved, because each of these two switches is subjected to less noise. Further, when one of these two switches becomes faulty, since the other switch is not affected by this fault switch, at least one voltage detection circuit can continue to operate normally.

Fourth Embodiment

Figure 4:
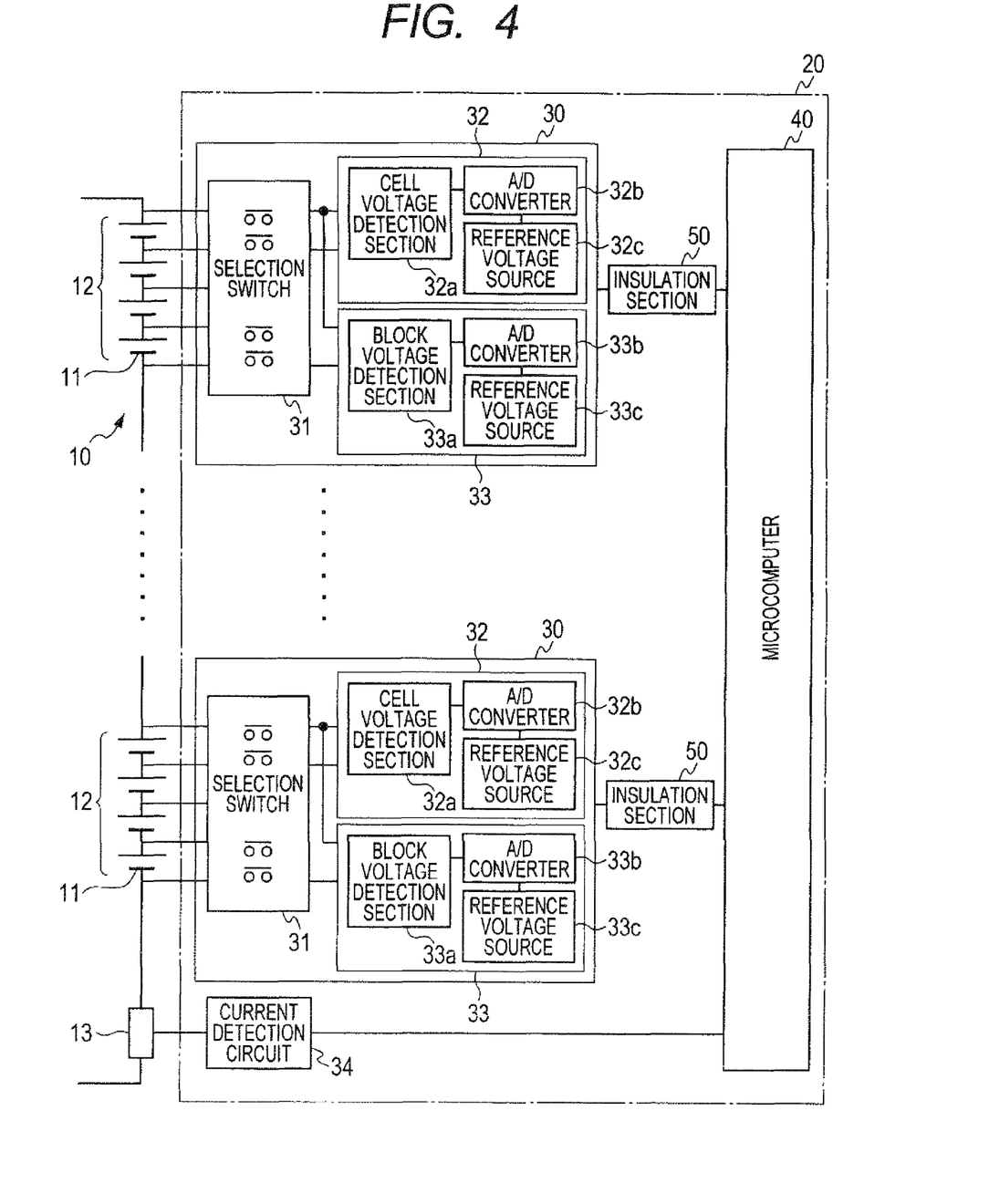
FIG. 4 is a diagram showing the structure of a battery pack monitoring system including a battery pack monitoring apparatus according to a fourth embodiment of the invention.

Next, a fourth embodiment of the invention is described focusing on the difference with the first to third embodiments. FIG. 4 is a diagram showing the overall structure of a battery pack monitoring system including a battery pack monitoring apparatus according to the fourth embodiment of the invention. In this embodiment, the cell monitoring circuit 30 on the highest voltage side is electrically connected to the microcomputer 40 through an insulation section 50. The cell monitoring circuit 30 on the lowest voltage side is also electrically connected to the microcomputer 40 through an insulation section 50. The insulation section 50 may be a photocoupler.

Further, unlike the above embodiments in which the current detection circuit 34 is provided in each of the cell monitoring circuits 40, the battery pack monitoring apparatus of this embodiment includes only one current detection circuit 34 for its whole structure. That is, in this embodiment, one current detection circuit 34 is provided for the whole battery pack 10. Accordingly, according to this embodiment, since it is not necessary to obtain data of the current for each of the cell monitoring circuits 30, the amount of data to be handled can be reduced.

As shown in FIG. 4, in this embodiment, the cell voltage detection circuit 32 is constituted of a cell voltage detection section 32a, an A/D converter 32b and a reference voltage source 32c, and the block voltage detection circuit 33 is constituted of a block voltage detection section 33a, an A/D converter 33b and a reference voltage source 33c.

The cell voltage detection section 32a is an analog circuit for detecting the cell voltage, and the block voltage detection section 33a is an analog circuit for detecting the block voltage. The A/D converter 32b is for converting the detected cell voltage into a digital signal, and the A/D converter 33b is for converting the detected block voltage into a digital signal. The reference voltage source 32c is for generating a reference voltage used in the A/D converter 32b, and the reference voltage source 33c is for generating a reference voltage used in the A/D converter 33b. As explained above, in this embodiment, the A/D converter 32b and the reference voltage source 32c are provided for the voltage detection circuit 32, while the A/D converter 33b and the reference voltage source 33c are provided for the voltage detection circuit 33, so that the voltage detection circuits 32 and 33 operate independently from each other.

In the cell voltage detection circuit 32, the cell voltage detected by the cell voltage detection section 32a is converted into a digital signal by the A/D converter 32b using the reference voltage generated by the reference voltage source 32c, and then outputted to the microcomputer 40. In the cell voltage detection circuit 33, the block voltage detected by the block voltage detection section 33a is converted into a digital signal by the A/D converter 33b using the reference voltage generated by the reference voltage source 33c, and then outputted to the microcomputer 40.

The microcomputer 40 detects a fault by performing comparison between the voltages outputted from the voltage detection circuits 32 and 33. For example, when each block 12 is constituted of four battery cells 11, the microcomputer 40 performs fault diagnosis of the cell monitoring circuit 30 by comparing four times the detected cell battery voltage of one of the four battery cells 11 with the detected block voltage, or comparing the sum of the detected cell voltages of the four battery cells 11 with the block voltage. Alternatively, the cell voltage of one of the battery cells 11 constituting the block 12 may be compared with the block voltage divided by the number of the battery cells 11 constituting the block 12.

As explained above, it is possible to detect a fault in the voltage detection circuits 32 and 33 by comparing the voltage detected by the cell voltage detection circuit 32 and the voltage detected by the block voltage detection circuit 33. According to this embodiment, the operation reliability of the battery pack monitoring apparatus 20 device can be improved.

Fifth Embodiment

Next, a fifth embodiment of the invention is described focusing on the difference with the fourth embodiment. In the fourth embodiment described above, the cell voltage detection circuit 32 and the block voltage detection circuit 33 are provided as separate and independent circuits. In the fifth embodiment, however, these circuits have some connection therebetween.

Figure 5:
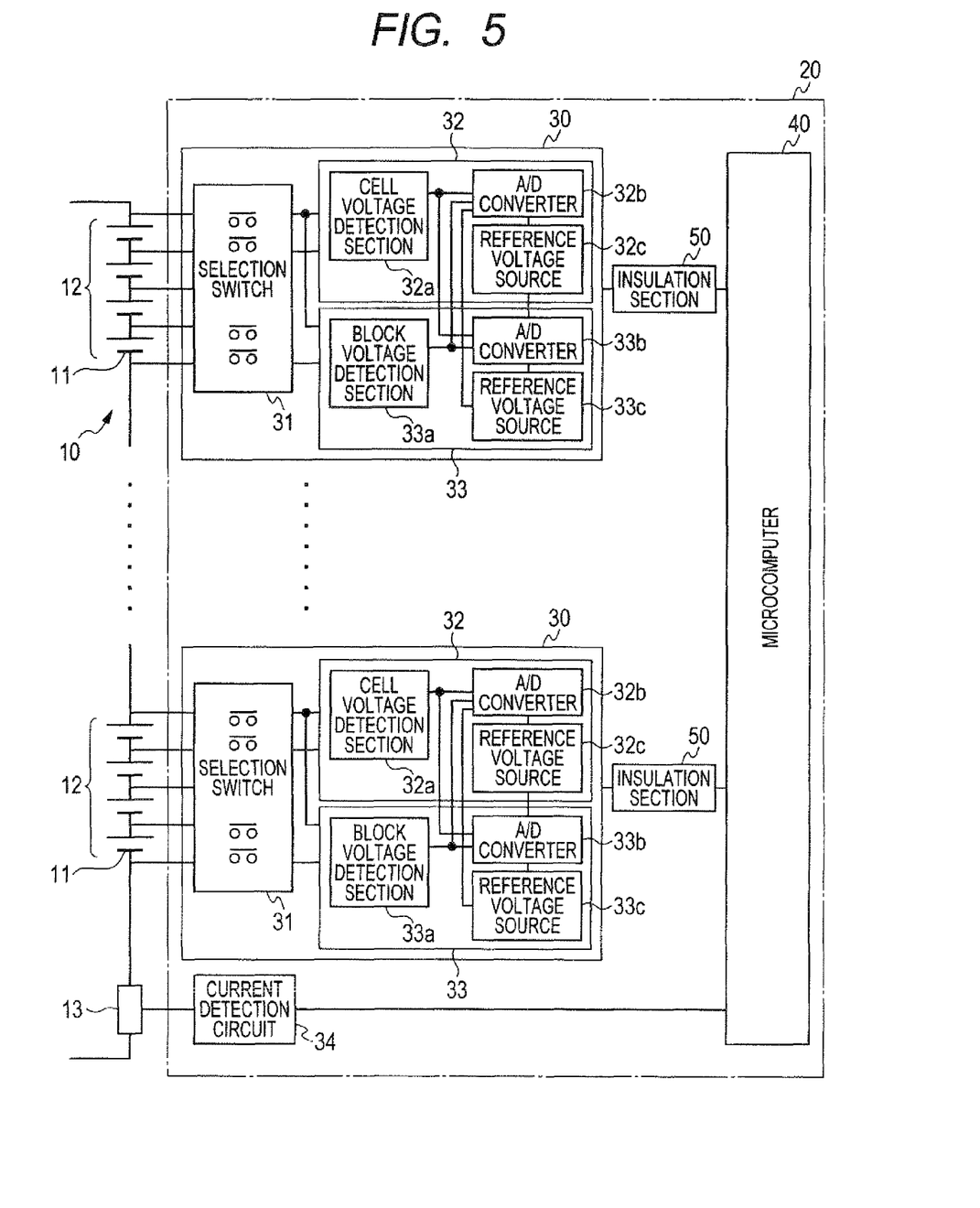
FIG. 5 is a diagram showing the structure of a battery pack monitoring system including a battery pack monitoring apparatus according to a fifth embodiment of the invention.

FIG. 5 is a diagram showing the overall structure of a battery pack monitoring system including the battery pack monitoring apparatus 20 according to the fifth embodiment. As shown in FIG. 5, in this embodiment, the cell monitoring circuit 30 is configured such that each of the outputs of the cell voltage detection section 32a and the block voltage detection section 33a is outputted to the A/D converter 32b of the cell voltage detection circuit 32 and to the A/D converter 33b of the block voltage detection circuit 33, and each of the reference voltages generated by the reference voltage source 32c and the reference voltage generated by the reference voltage source 33c is supplied to the A/D converter 32b and to the A/D converter 33b.

That is, in this embodiment, the cell monitoring circuit 30 has means to change the internal signal paths thereof so that each of the A/D converters 32b and 33b is applied with one of the cell voltage detected by the cell voltage detection circuit 32 and the block voltage detected by the block voltage detection circuit 33, and supplied with one of the reference voltage generated by the reference voltage source 32c and the reference voltage generated by the reference voltage source 33c.

The means to change the internal signal paths may be constituted of a multiplexer. In this case, the multiplexer is provided in each of the cell monitoring circuits 30, and operates to change the internal signal paths in accordance with a command received from the microcomputer 40.

Usually, the multiplexer connects the A/D converter 32b of the cell voltage detection circuit 32 with the cell voltage detection section 32a and the reference voltage source 32c, and connects the A/D converter 33b of the block voltage detection circuit 33 with the block voltage detection section 33a and the reference voltage source 33c, in order to detect the cell voltage and block voltage.

On the other hand, at the time of performing fault diagnosis, the multiplexer connects the A/D converter 32b of the cell voltage detection circuit 32 with the cell voltage detection section 32a, the block voltage detection section 33a and the reference voltage source 33c, and connect the A/D converter 33b of the block voltage detection circuit 33 with the cell voltage detection section 32a, the block voltage detection section 33a and the reference voltage source 32c, in order to make a determination of presence or absence of a fault in the cell monitoring circuit 30 based on the results of comparisons between the outputs of the A/D converters 32b and 33b.

As explained above, according to this embodiment, since the internal signal paths of the multiplexer are changeable, it is possible to perform fault diagnosis in more detail by comparing the outputs of the A/D converters 32b and 33b received in the microcomputer 40.

Further, since the components of the cell voltage detection circuit 32 and the components of the block voltage detection circuit 33 are connectable to each other, even when one of the A/D converters 32b and 33b malfunctions, it is possible to continue the voltage detection by using the other of the A/D converters 32b and 33b. This redundancy in the voltage detection makes it possible to deal with occurrence of a fault.

Sixth Embodiment

Figure 6:
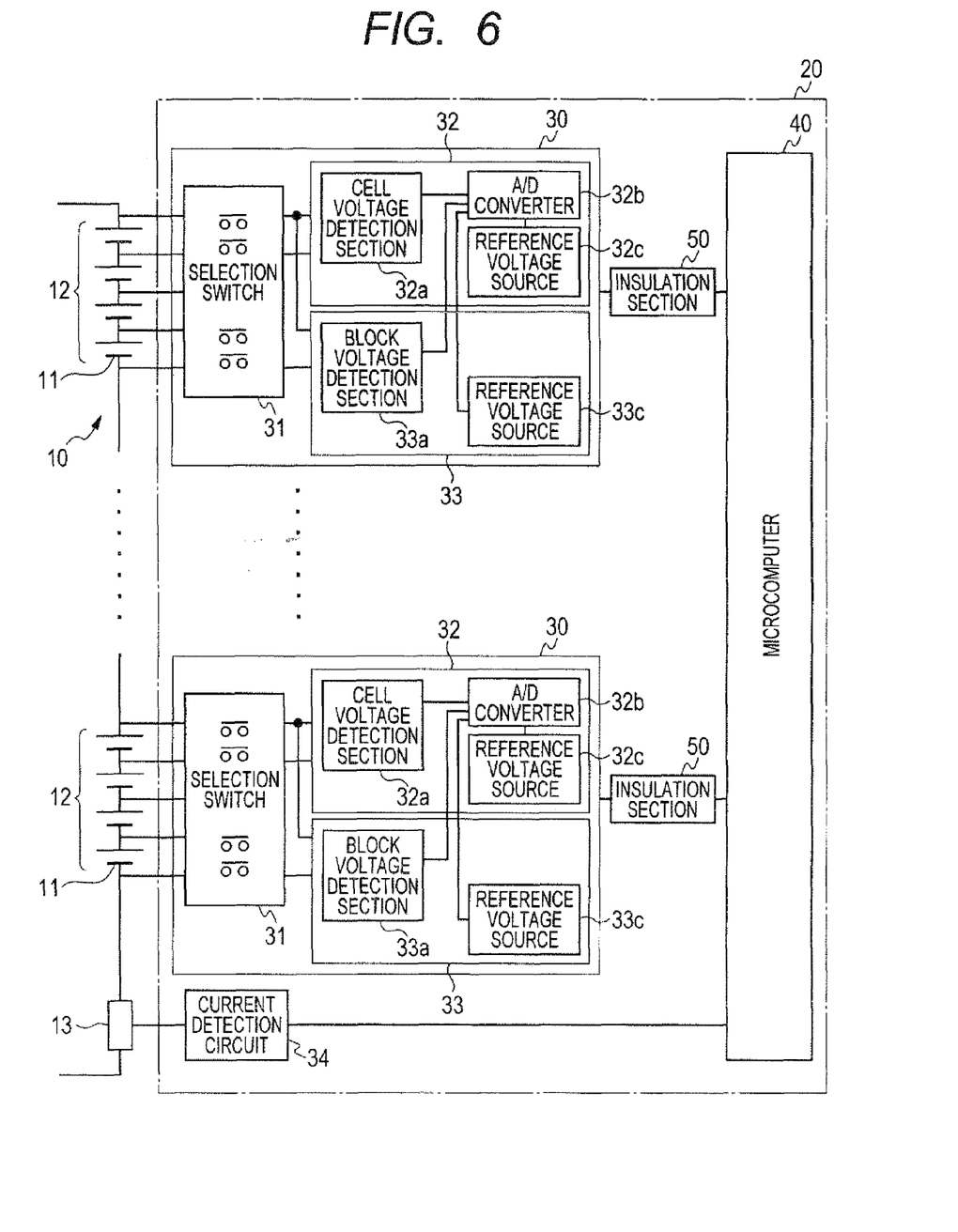
FIG. 6 is a diagram showing the structure of a battery pack monitoring system including a battery pack monitoring apparatus according to a sixth embodiment of the invention.

Next, a sixth embodiment of the invention is described focusing on the difference with the fifth embodiment. FIG. 6 is a diagram showing the overall structure of a battery pack monitoring system including the battery pack monitoring apparatus 20 according to a sixth embodiment of the invention.

A shown in FIG. 6, in this embodiment, the cell voltage detection circuit 32 includes the cell voltage detection section 32a, the A/D converter 32b and the reference voltage source 32c, and the block voltage detection circuit 33 includes the block voltage detection section 33a and the reference voltage source 33c. The block voltage detection circuit 33 does not include the A/D converter 33b. Accordingly, according to this embodiment, the circuit scale of the cell monitoring circuit 30 can be reduced.

Further, in this embodiment, the block voltage detection section 33a and the reference voltage source 33c are connectable to the A/D converter 32b of the cell voltage detection circuit 32. The connection between the A/D converter 32b and one of the cell voltage connection section 32b, the block voltage detection section 33a and the reference voltage sources 32c and 33c can be switched therealong by the multiplexer in accordance with a command from the microcomputer 40. Accordingly, by performing switching between one of the reference voltages 32c and 33c and the A/D converter 32b, it is possible to detect both the cell voltage and the block voltage.

The microcomputer 40 can perform fault diagnosis for the components of the cell monitoring circuit 30 by performing comparison between the detection result provided by the cell voltage detection section 32a and the detection result provided by the block voltage detection section 33a. Further, by outputting the reference voltages generated by the reference voltage sources 32c and 33c through the A/D converter 32b and determining whether these known reference voltages can be detected correctly, it is possible to detect a fault in more detail.

As explained above, the cell monitoring circuit 30 may be provided with only the one A/D converter 32b.

Although the above description is made to the case where the cell voltage detection circuit 32 includes the A/D converter 32b, the sixth embodiment may be modified such that the cell voltage detection circuit 32 includes the reference voltage source 32c, and the block voltage detection circuit 33 includes the A/D converter 33b and the reference voltage source 33c.

It is a matter of course that various modifications can be made to the above embodiments as described below. In the above embodiments, the battery pack monitoring apparatus 20 is used to monitor a battery pack mounted on a vehicle. However, the present invention can be used to monitor a battery pack not mounted on a vehicle The above embodiments may be modified such that the functions of the microcomputer 40 are performed by the respective cell monitoring circuits 30. For example, although the microcomputer 40 detects overcharge and overdischarge of the battery cells 11 by performing comparison between the cell voltage and the overcharge threshold or overdischarge threshold in the above embodiments, the respective cell monitoring circuits 30 may perform the comparison to detect overcharge and overdischarge of the battery cells 11. In this case, the cell monitoring circuits 30 are configured to output their detection results of overcharge and overdischarge of the battery cells 11 to the microcomputer 40.

Also, the cell monitoring circuits 30 may be configured to calculate the remaining capacities of the blocks 12, and output their calculation results to the microcomputer 40. In this case, the microcomputer 40 calculates the remaining capacity of the battery pack 10 by adding up the calculation results of the blocks 12.

Further, although the microcomputer 40 performs fault detection for the cell voltage detection circuit 32 and the block voltage detection circuit 33 by comparing the sum of the cell voltages of the four battery cells 11 constituting the block 12 with the block voltage of the block 12 in the above embodiments, the cell monitoring circuits 30 may be configured to perform the fault detection. Further, each of the cell monitoring circuits 30 may be configured to set the block voltage detection frequency higher than the cell voltage detection frequency when the received block voltage exceeds the predetermined range.

The above explained preferred embodiments are exemplary of the invention of the present application which is described solely by the claims appended below. It should be understood that modifications of the preferred embodiments may be made as would occur to one of skill in the art.

What is claimed is:

1. A battery pack monitoring apparatus for monitoring a battery pack constituted of battery blocks connected in series and each including battery cells connected in series, comprising:
    cell monitoring circuits provided respectively for the battery blocks, each of the cell monitoring circuits including a cell voltage detection circuit to detect cell voltages of the battery cells included in a corresponding one of the battery blocks, and a block voltage detection circuit to detect a block voltage of the corresponding one of the battery blocks; and
    a control circuit configured to detect states of the battery cells based on the cell voltages and the block voltages transmitted from the respective cell monitoring circuits,
    wherein a first frequency at which the cell voltage of each of the battery cells is detected is variably set in the cell voltage detection circuit of each of the cell monitoring circuits, and a second frequency at which the block voltage of the battery block is detected is variably set in the block voltage detection circuit of each of the cell monitoring circuits.

2. The battery pack monitoring apparatus according to claim 1, wherein the second frequency is higher than the first frequency.

3. The battery pack monitoring apparatus according to claim 1, wherein each of the battery cells is a rechargeable battery, and each of the cell monitoring circuits sets the first frequency higher than the second frequency when the detected block voltage deviates from a predetermined range.

4. The battery pack monitoring apparatus according claim 1, wherein each of the cell monitoring circuits includes a selection switch for making a connection of positive and negative electrodes of one of the battery cells constituting the corresponding one of the battery blocks with input terminals of the cell voltage detection circuit included therein, and making a connection of a positive electrode of the battery cell on the highest voltage side of the corresponding one of the battery blocks and a negative electrode of the battery cell on the lowest voltage side of the corresponding one of the battery blocks with input terminals of the block voltage detection circuit included therein.

5. The battery pack monitoring apparatus according claim 1, wherein each of the cell monitoring circuits includes a first selection switch for making a connection of positive and negative electrodes of one of the battery cells constituting the corresponding one of the battery blocks with input terminals of the cell voltage detection circuit included therein, and a second selection switch for making a connection between a positive terminal of the battery cell on the highest voltage side of the corresponding one of the battery blocks and a negative electrode of the battery cell on the lowest voltage side of the corresponding one of the battery blocks with input terminals of the block voltage detection circuit included therein.

6. The battery pack monitoring apparatus according claim 1, further comprising a current detection circuit for detecting a current flowing through the battery pack.

7. A battery pack monitoring apparatus for monitoring a battery pack constituted of battery blocks connected in series and each including battery cells connected in series, comprising:
    cell monitoring circuits provided respectively for the batter blocks, each of the cell monitoring circuits including a cell voltage detection circuit detect cell voltages of the battery cells included, in a corresponding one of the battery blocks, and a block voltage detection circuit to detect a block voltage of the corresponding one of the battery blocks; and
    a circuit configured to detect states of the battery cells based on the cell voltages and the block voltages transmitted front the respect cell monitoring circuits,
    wherein each of the cell voltage detection circuits includes a first A/D converter for converting the detected cell voltage into a digital signal using a first reference voltage, and a first reference voltage source for generating the first reference voltage, and each of the block voltage detection circuits includes a second A/D converter for converting the detected block voltage into a digital signal using a second reference voltage and a second reference voltage source for generating the second reference voltage.

8. The battery pack monitoring apparatus according claim 7, wherein internal signal paths of each of the cell monitoring circuits are made changeable so that each of the first and second A/D converters can be inputted with a selected one the detected cell voltage, the first reference voltage, the detected block voltage and the second reference voltage.

9. A battery pack monitoring apparatus for monitoring a battery pack constituted of battery blocks connected in series and each including battery cells connected in series, comprising:
    cell monitoring circuits provided respectively for the battery blocks, each of the cell monitoring circuits including a cell voltage detection circuit to detect cell voltages of the battery cells included in a corresponding one of the battery blocks, and a block voltage detection circuit to detect a block voltage of the corresponding one of the battery blocks; and
    a control circuit configured to detect states of the battery cell based on the cell voltages and the block voltages transmitted from the respective cell monitoring circuits,
    wherein one of the cell voltage detection circuit and the block voltage detection circuit of each of the cell monitoring circuits includes an A/D converter for converting a selected one of the detected cell voltage into a digital signal using a first reference voltage and converting the detected block voltage into a digital signal using a second reference voltage, each of the cell voltage detection circuit includes a first reference voltage source for generating the first reference voltage, each of the block voltage detection circuits includes a second reference voltage source for generating the second reference voltage, and internal signal paths of each of the cell monitoring circuits are made changeable so that a selected one of the first and second reference voltage can be inputted to the A/D converter thereof.

* * * * *

UNITED STATES PATENT AND TRADEMARK OFFICE
CERTIFICATE OF CORRECTION

PATENT NO. : 8,489,347 B2
APPLICATION NO. : 13/025488
DATED : July 16, 2013
INVENTOR(S) : Shimizu Page 1 of 1

It is certified that error appears in the above-identified patent and that said Letters Patent is hereby corrected as shown below:

In the Claims:
Column 12, line 11, claim 7, "batter" should read --battery--; Column 12, line 13, "circuit detect cell voltages" should read --circuit to detect cell voltages--; and Column 12, line 18, "a circuit" should read --a control circuit--.

Signed and Sealed this
Twelfth Day of November, 2013

Teresa Stanek Rea
*Deputy Director of the United States Patent and Trademark Office*